United States Patent
Okumura et al.

[19]

[11] Patent Number: 5,888,413
[45] Date of Patent: Mar. 30, 1999

[54] PLASMA PROCESSING METHOD AND APPARATUS

[75] Inventors: Tomohiro Okumura, Neyagawa; Ichiro Nakayama, Kadoma; Yoshihiro Yanagi, Neyagawa, all of Japan

[73] Assignee: Matsushita Electric Industrial Co., Ltd., Kadoma, Japan

[21] Appl. No.: 656,851

[22] Filed: May 30, 1996

[30] Foreign Application Priority Data

Jun. 6, 1995 [JP] Japan ...................... 7-138348

[51] Int. Cl.$^6$ .................. C23F 1/02; C23F 1/08
[52] U.S. Cl. .................. 216/68; 156/345; 118/723 I
[58] Field of Search ............ 156/345; 204/298.37, 204/298.38; 118/723 E, 723 IR; 216/59, 68

[56] References Cited

U.S. PATENT DOCUMENTS

| | | | |
|---|---|---|---|
| 4,451,436 | 5/1984 | O'Hare | 422/186.29 |
| 5,034,086 | 7/1991 | Sato | 156/345 |
| 5,266,364 | 11/1993 | Tamura et al. | 427/571 |
| 5,531,834 | 7/1996 | Ishizuka et al. | 118/723.1 |

*Primary Examiner*—Lynette F. Smith
*Assistant Examiner*—Brenda G. Brumback
*Attorney, Agent, or Firm*—Wenderoth, Lind & Ponack, L.L.P.

[57] ABSTRACT

In a plasma processing method, a substrate is processed by placing the substrate on an electrode in a vacuum chamber, introducing a gas into the vacuum chamber while discharging gas from inside vacuum chamber, applying a high frequency voltage to a spiral discharge coil while keeping the vacuum chamber internally at a pressure to generate a plasma inside the vacuum chamber. At least one of the control parameters of gas type, gas flow rate, pressure, magnitudes of high frequency powers applied to the coil and the electrode, and their high frequency power frequencies is varied while the substrate is processed. The method includes a step of allowing a plasma density in-plane distribution to be controlled in accordance with the timing of varying any of the control parameters.

16 Claims, 15 Drawing Sheets

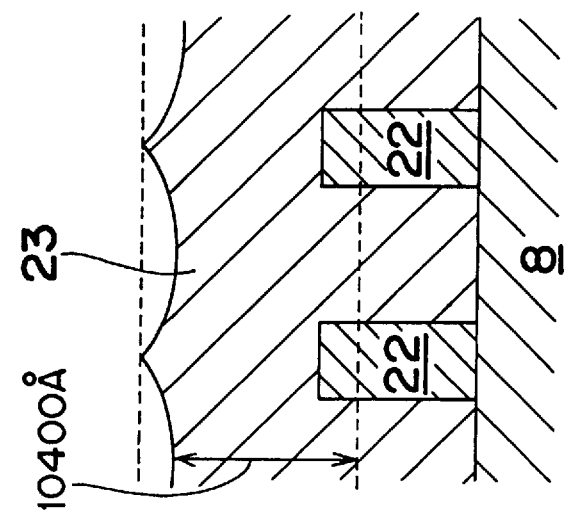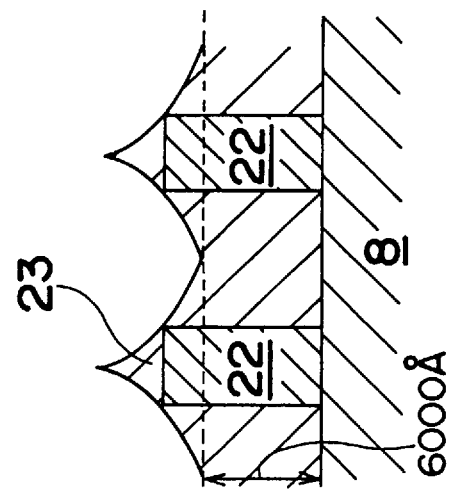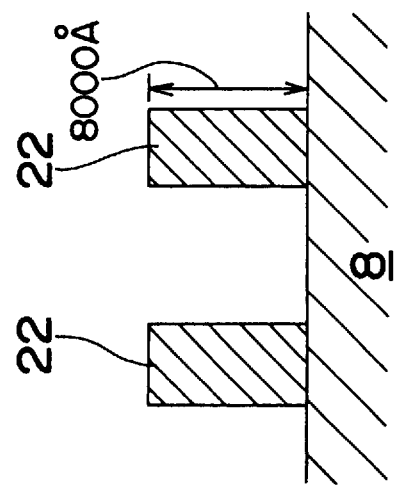

PLASMA PROCESSING METHOD AND APPARATUS

BACKGROUND OF THE INVENTION

The present invention relates to plasma processing method and apparatus used for dry etching and plasma CVD etc.

In recent years, to effect processing or the like on a semiconductor element at a high aspect ratio by dry etching technique or effect embedding or the like at a high aspect ratio by plasma CVD technique coping with developing dimensional fineness of semiconductor elements, it has been required to effect plasma processing in higher vacuum.

For instance, in the case of dry etching, when a high density plasma is generated in high vacuum, there is a reduced possibility of collision between ions and ions or other neutral gas particles in an ion sheath formed on a substrate surface, and therefore, directions of the ions are aligned toward the substrate surface. Furthermore, because of a high degree of electrolytic dissociation, there results a high incident particle flux ratio of ions arriving at the substrate to neutral radicals. For the above-mentioned reasons, etching anisotropy is improved by generating a high density plasma in high vacuum, thereby allowing processing to be achieved at a high aspect ratio.

Furthermore, in the case of plasma CVD, when a high density plasma is generated in high vacuum, an effect of embedding and flattening a fine pattern can be obtained by a sputtering effect with ions, thereby allowing embedding to be achieved at a high aspect ratio.

As one of plasma processing apparatuses capable of generating high density plasmas in high vacuum, there is a high frequency induction type plasma processing apparatus which generates plasma inside a vacuum vessel by applying a high frequency voltage to a discharge coil. The plasma processing apparatus of this type generates a high frequency magnetic field inside the vacuum vessel and accelerates electrons by generating an induction field inside the vacuum vessel by the high frequency magnetic field to generate plasma.

A known high frequency induction type plasma processing apparatus, has a planar spiral discharge coil 13 as shown in FIG. 15. The planar spiral discharge coil 13 is fixed on a surface opposite to a substrate 14. In FIG. 15, when an appropriate gas is introduced from an introduction inlet 20 into a vacuum vessel 15 while gas inside the vacuum vessel 15 is discharged from a discharge outlet 21 and a high frequency voltage is applied to the planar spiral discharge coil 13 by a discharge coil connected to high frequency power source 16 with the vacuum vessel 15 kept internally at an appropriate pressure, a plasma is generated inside the vacuum vessel 15 to allow the substrate 14 placed on a lower electrode 17 to be subjected to plasma processing such as etching, deposition, and surface improvement. In this case, as shown in FIG. 15, an ion energy reaching the substrate 14 can be controlled by additionally applying a high frequency voltage to the lower electrode 17 from a lower electrode using high frequency power source 18.

However, with the system shown in FIG. 15 a plasma density in-plane distribution is hardly controlled since the planar spiral discharge coil 13 is fixed on the surface opposite to the substrate 14. This will be described in detail below.

As a principal control parameter with regard to the generation of plasma, there can be enumerated gas type, gas flow rate, pressure, high frequency powers, and high frequency power frequencies. In a case where an identical discharge coil is used, the plasma density in-plane distribution varies when these control parameters are varied. An example of the above is shown in FIGS. 16A and 16B. FIG. 16A shows a measurement result obtained by measuring a plasma density distribution on a line parallel to the substrate by a Langmuir probe in the case where the gas type is argon, the gas flow rate is 30 SCCM, the pressure is 5 mTorr and the high frequency power is 1000 W. Uniformity within a range in diameter of 200 mm was a satisfactory value of ±2.3%. However, the plasma density distribution in the case where the pressure is 50 mTorr and the other conditions are same results as shown in FIG. 16B, when the uniformity within the range in diameter of 200 mm was ±8.8%.

In the case of dry etching, it is sometimes desired to etch a variety of thin films by means of an identical plasma processing apparatus. In such a case, the control parameters such as the gas type and pressure also differ depending on the thin film that is desired to be etched. In the prior art plasma processing apparatus, a certain thin film can be uniformly etched, however, the etching uniformity cannot always be obtained for other thin films. In regard to plasma CVD, the same issue exists.

Furthermore, in the case of dry etching, are varied the control parameters in the course of processing when processing one substrate. For example, in polysilicon etching, there is a process of etching a natural oxide film formed on a surface of polysilicon, and this is followed by a process of etching the polysilicon. These two processes are performed within an identical plasma processing apparatus. However, they have different control parameters, and normally the gas type is changed. In such a case, there arises the issue that no substrate in-plane uniformity of etching characteristics such as etching rate and etching form cannot be obtained when varied plasma density in-plane distributions are provided in the first process and the second process. Not limited to the polysilicon etching, it has been known to change the control parameters in the course of processing one substrate in many plasma processing cases by dry etching and plasma CVD. However, when such a process is performed by means of the prior art plasma processing apparatus as shown in FIG. 15, the substrate in-plane uniformity of the plasma processing cannot be obtained.

SUMMARY OF THE INVENTION

Accordingly, it is an object of the present invention to provide a plasma processing method and apparatus having an excellent controllability of a plasma density in-plane distribution.

In accomplishing these and other aspects, according to a first aspect of the present invention, there is provided a plasma processing method for processing a substrate by placing the substrate on an electrode in a vacuum chamber, introducing a gas into the vacuum chamber while discharging from inside the vacuum chamber gas, applying a high frequency voltage to a spiral discharge coil while keeping the vacuum chamber internally at a pressure to generate a plasma inside the vacuum chamber. At least one of the control parameters of gas type, gas flow rate, pressure, magnitudes of high frequency powers applied to the coil and the electrode, and their high frequency power frequencies is varied while the substrate is processed.

The method comprises a step of allowing a plasma density in-plane distribution to be controlled in accordance with a timing of varying any of the control parameters.

According to a second aspect of the present invention, there is provided a plasma processing apparatus comprising:

an electrode for receiving thereon a substrate in a vacuum chamber;

a spiral discharge coil for generating a plasma inside the vacuum chamber by applying a high frequency voltage to the discharge coil; and a device for changing a shape of the spiral discharge coil so that a pitch in a diameter direction of the coil is partially changed, thereby allowing a plasma density in-plane distribution to be controllable.

According to a third aspect of the present invention, there is provided a plasma processing method for forming a film on a substrate by placing the substrate on an electrode in a vacuum chamber, introducing a gas into the vacuum chamber while discharging inside gas, applying a high frequency voltage to a spiral discharge coil while keeping the vacuum chamber internally at a pressure to generate a plasma inside the vacuum chamber.

The method comprises the steps of:

varying at least one of control parameters of gas type, gas flow rate, pressure, magnitudes of high frequency powers applied to the coil and the electrode, and their high frequency power frequencies while the substrate is processed; and thereby changing a shape of the spiral discharge coil so that a uniformity of film forming rate obtained before and after varying the control parameter is compensated in accordance with a timing of varying the control parameter in a course of forming the film.

According to a fourth aspect of the present invention, there is provided a plasma processing method for etching a substrate by placing the substrate on an electrode in a vacuum chamber, introducing a gas into the vacuum chamber while discharging inside gas, applying a high frequency voltage to a spiral discharge coil while keeping the vacuum chamber internally at a pressure to generate a plasma inside the vacuum chamber.

The method comprises the steps of:

varying at least one of control parameters of gas type, gas flow rate, pressure, magnitudes of high frequency powers applied to the coil and the electrode, and their high frequency power frequencies while the substrate is processed; and thereby changing a shape of the spiral discharge coil so that a uniformity of etching rate obtained before and after varying the control parameter is compensated in accordance with a timing of varying the control parameter in a course of etching.

BRIEF DESCRIPTION OF THE DRAWINGS

These and other aspects and features of the present invention will become clear from the following description taken in conjunction with the preferred embodiments thereof with reference to the accompanying drawings, in which:

FIGS. 7A, 7B, and 7C are sectional views showing film forming processes of the first embodiment;

DETAILED DESCRIPTION OF THE PREFERRED EMBODIMENTS

Figure 1:
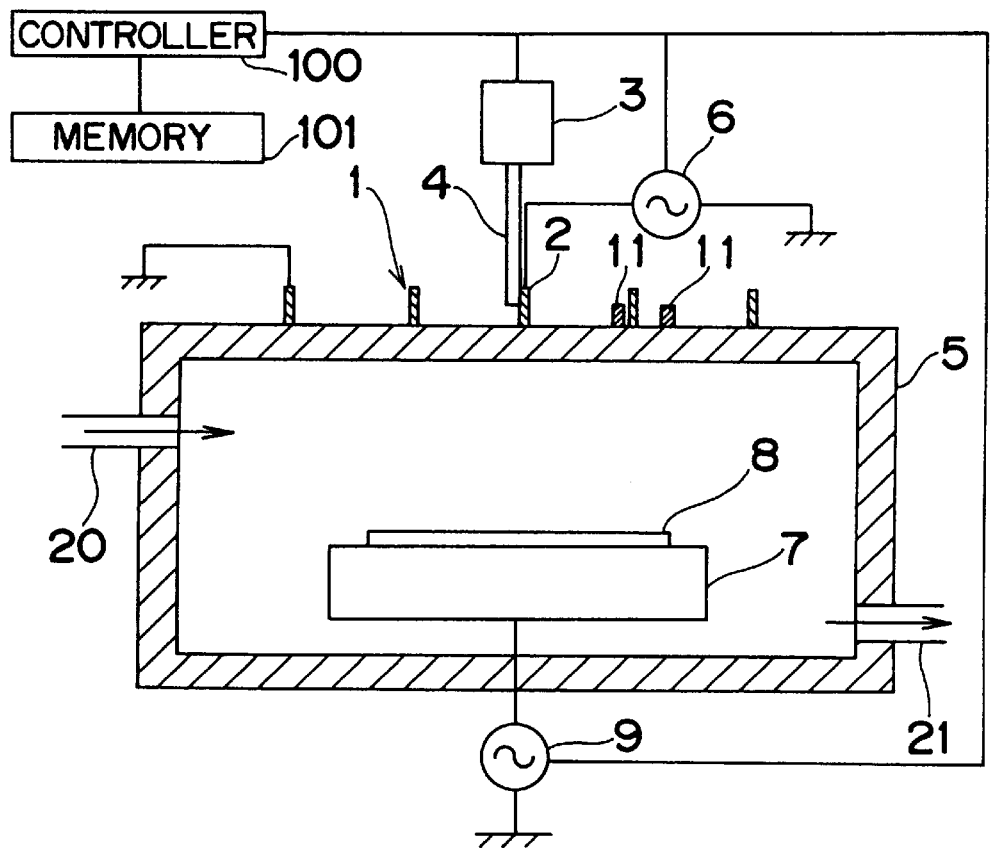
FIG. 1 is a partial sectional view showing the construction of a plasma processing apparatus according to a first embodiment of the present invention.

Before the description of the present invention proceeds, it is to be noted that like parts are designated by like reference numerals throughout the accompanying drawings.

A first embodiment of the present invention will be described with reference to FIGS. 1 through 8 taking formation of a silicon oxide film by means of the plasma CVD method as an example.

In FIG. 1, a planar spiral discharge coil 1 is provided on a surface opposite to a substrate 8. A center side end 2 of the planar spiral discharge coil 1 is connected to a rotary shaft 4 of a stepping motor 3 which serves as a rotary actuator. The stepping motor 3 is driven under the control of a controller 100 and the controller 100 controls the plasma processing based on control parameters stored in a memory 101. The control parameters are composed of gas type, gas flow rate, pressure, high frequency power applied to the coil 1, high frequency power applied to a lower electrode 7, and high frequency power frequencies of the high frequency powers. A plasma density in-plane distribution is controlled in accordance with the timing of varying at least one of the control parameters.

By introducing an appropriate gas from an introduction inlet 20 into a vacuum vessel 5 while discharging inner gas from a discharge outlet 21 and applying a high frequency voltage to the planar spiral discharge coil 1 by means of a discharge coil connected to high frequency power source 6 while keeping the vacuum vessel 5 internally at an appropriate pressure, a plasma is generated inside the vacuum vessel 5 to allow the substrate 8 placed on a lower electrode 7 to be subjected to plasma processing such as etching, deposition, and surface improvement.

In the above case, by additionally applying a high frequency voltage to the lower electrode 7 from a lower electrode use high frequency power source 9, ion energy reaching the substrate 8 can be controlled.

Figure 2:
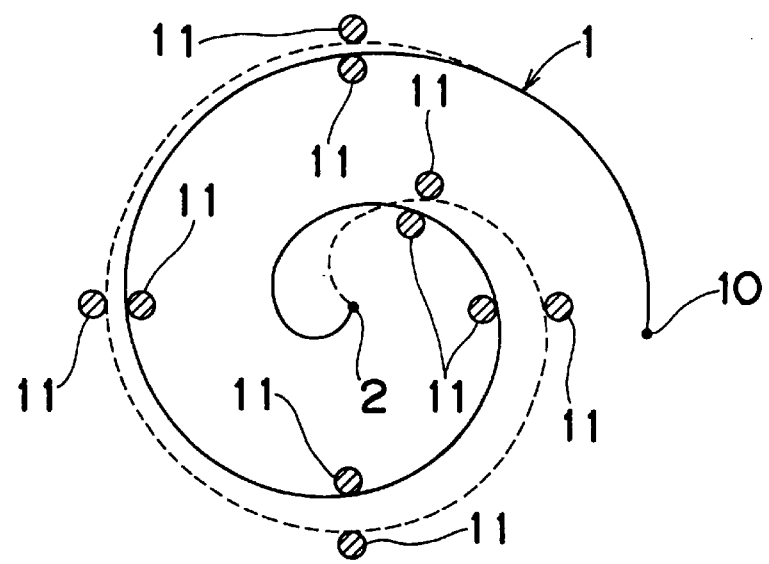
FIG. 2 is a plan view showing the details of a planar spiral discharge coil of the first embodiment.

As shown in FIG. 2, the planar spiral discharge coil 1 has a structure such that its outer peripheral side end 10 is fixed, however, the other portion thereof is not fixed so that the planar spiral discharge coil 1 can change its shape when its center side end 2 is turned.

On both sides of a plurality of portions in the lengthwise direction of the planar spiral discharge coil 1 is oppositely provided a pair of guides 11. The and the planar spiral discharge coil 1 can take a shape as indicated by a solid line in FIG. 2 (this shape will be referred to as an A-shape hereinafter) and a shape as indicated by a dashed line in FIG. 2 (this shape will be referred to as a B-shape hereinafter) depending on the rotary angle of the rotary shaft 4 of the stepping motor 3.

By turning the rotary shaft 4 of the stepping motor 3 clockwise by an angle of 150° from the A-shape of the planar spiral discharge coil 1, the shape of the planar spiral discharge coil 1 changes into the B-shape. In the case of the A-shape, an interval between mutually adjacent portions of the conductive wire constituting the planar spiral discharge coil 1, on the other words, a pitch in the diameter direction of the discharge coil 1 is smaller in the center portion of the planar spiral discharge coil 1 than at the peripheral portion as compared with the B-shape. When the control parameter values are same, the plasma density in the center portion of the planar spiral discharge coil 1 is made relatively greater than in the peripheral portion.

Figure 3:
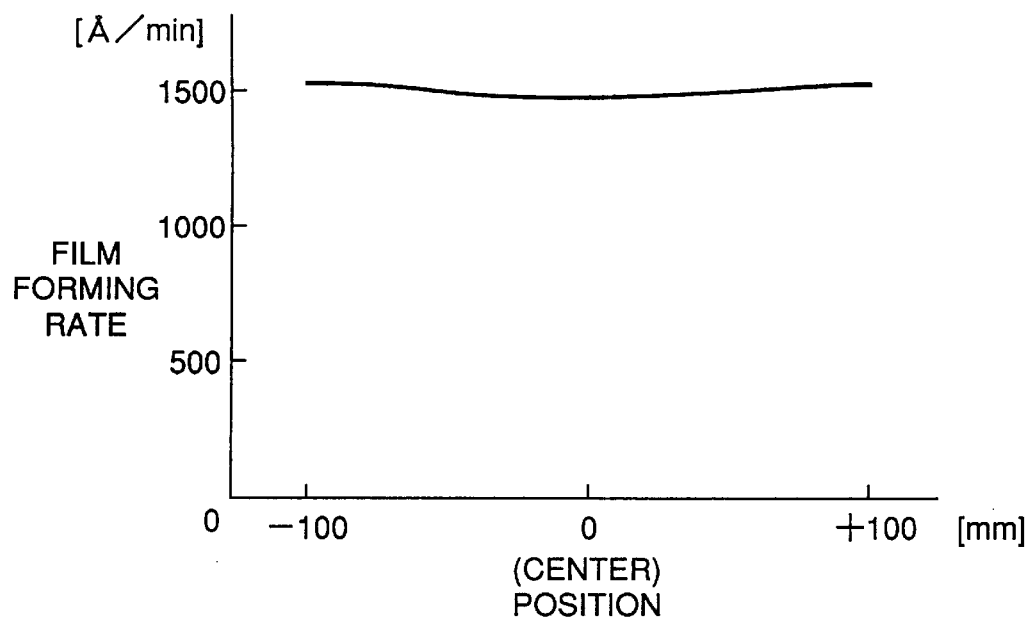
FIG. 3 is a graph showing an in-plane distribution characteristic of a film forming rate according to the first embodiment.

FIG. 3 shows an in-plane distribution of a film forming rate when a silicon oxide film is formed on the substrate 8 with the planar spiral discharge coil 1 made to have the B-shape. The control parameters of gas type, gas flow rate, pressure, high frequency power applied to the coil 1, high frequency power applied to the lower electrode 7, and their high frequency power frequencies are $SiH_4/O_2/Ar=5/10/50$ sccm, 5 mTorr, 1500 W, 800 W, and 13.56 MHz, respectively.

As is apparent from FIG. 3, the in-plane distribution of the film forming rate is satisfactory, and its value was 1500 Å/min±1.3%.

Figure 4:
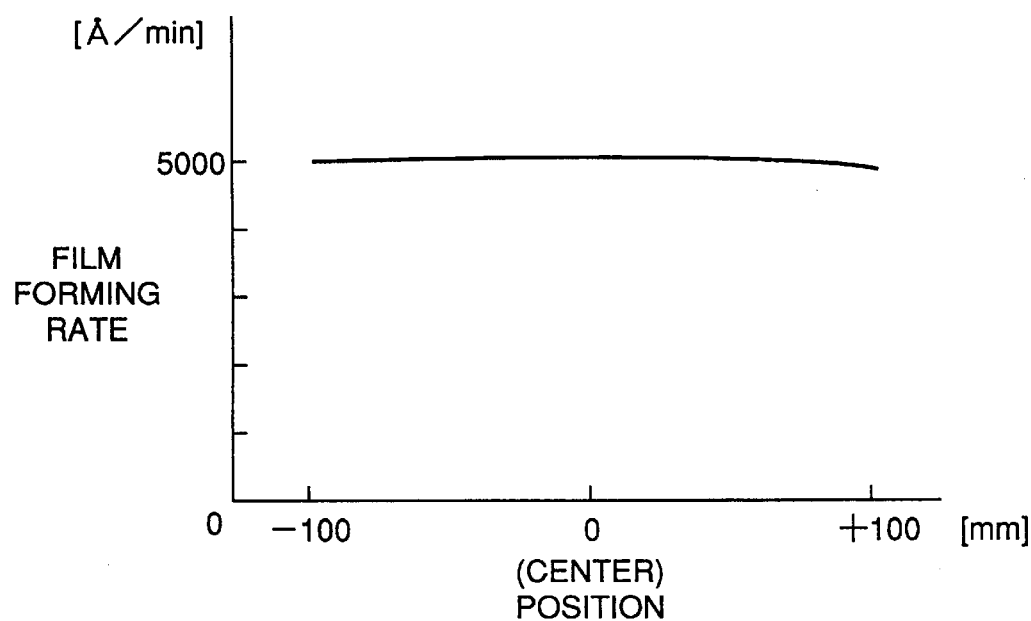
FIG. 4 is a graph showing an in-plane distribution characteristic of the film forming rate of the first embodiment.

The above film forming conditions are the conditions for obtaining the effect of embedding and flattening a fine pattern taking advantage of a sputtering effect by Ar ions through incorporation of Ar into a reaction gas. When performing the embedding of a fine pattern, the film forming condition is sometimes changed into a high speed film forming condition by stopping the supply of Ar in the course of processing. FIG. 4 shows an in-plane distribution of the film forming rate when a silicon oxide film is formed on the substrate 8 with the planar spiral discharge coil 1 made to have the A-shape. The control parameters of gas type, gas flow rate, pressure, high frequency power applied to the coil 1, high frequency power applied to the lower electrode 7, and their high frequency power frequencies were $SiH_4/O_2=$ 15/30 sccm, 5 mTorr, 1500 W, 100 W, and 13.56 MHz, respectively. As is apparent from FIG. 4, the in-plane distribution of the film forming rate is satisfactory, and its value was 5000 Å/min±1.0%.

Figure 5:
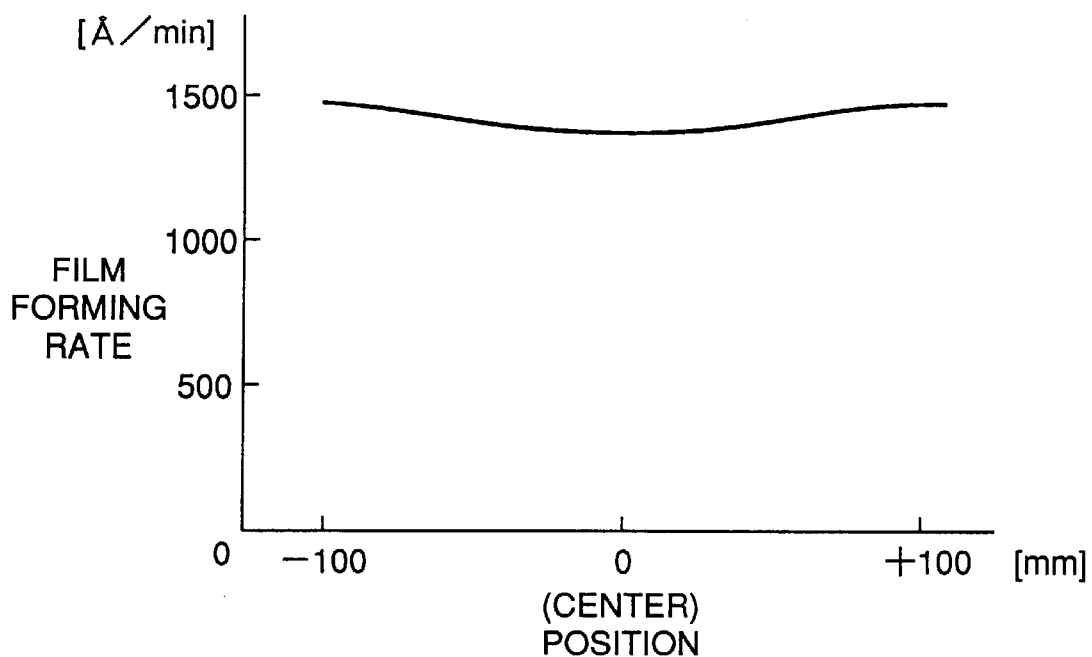
FIG. 5 is a graph showing an in-plane distribution characteristic of the film forming rate of the first embodiment.

For the sake of comparison, FIG. 5 shows an in-plane distribution of the film forming rate when a silicon oxide film is formed on the substrate 8 under the embedding and flattening conditions with the planar spiral discharge coil 1 made to have the A-shape.

Figure 6:
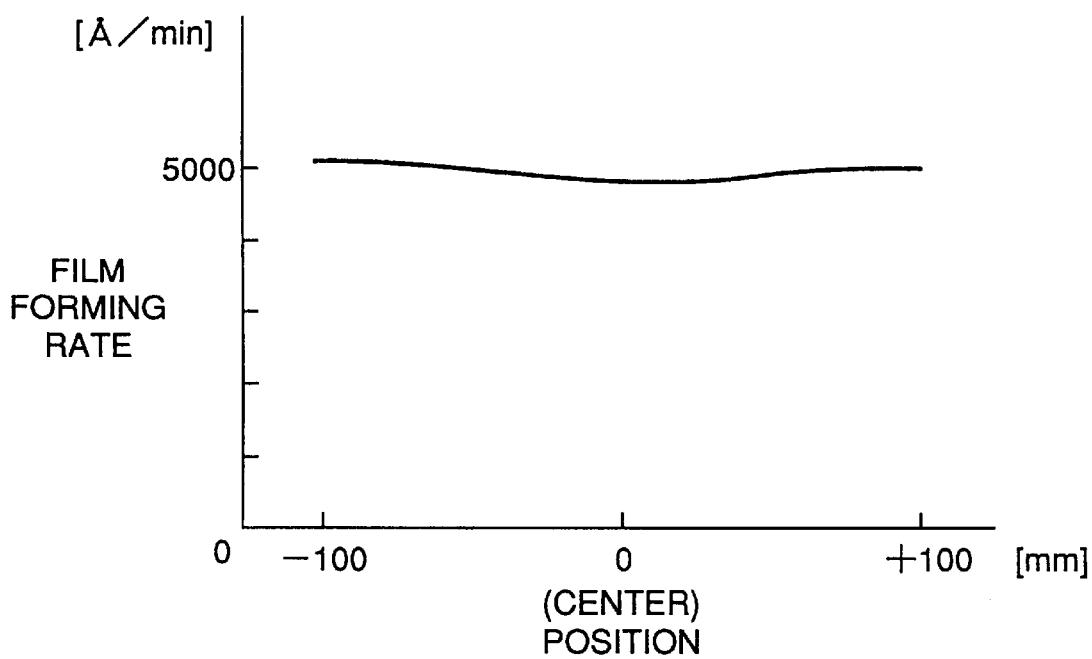
FIG. 6 is a graph showing an in-plane distribution characteristic of the film forming rate of the first embodiment.

The control parameter values are the same as those in the case where the result shown in FIG. 3 is obtained. As is apparent from FIG. 5, when the planar spiral discharge coil 1 has the A-shape, the plasma density is high in the center portion of the substrate 8, and conversely the plasma density is low in the peripheral portion of the substrate 8. Therefore, the sputtering rate is greater in the center portion of the substrate 8, while the film forming rate is greater in the peripheral portion of the substrate 8. The film forming rate with its uniformity was 1400 Å/min±3.7%. Further, FIG. 6 shows an in-plane distribution of the film forming rate when a silicon oxide film is formed on the substrate 8 with the planar spiral discharge coil 1 having the B-shape. The control parameter values are the same as those in the case where the result shown in FIG. 4 is obtained.

As is apparent from FIG. 6, when the planar spiral discharge coil 1 has the B-shape, the plasma density is low in the center portion of the substrate 8, and conversely the plasma density is high in the peripheral portion of the substrate 8. Therefore, decomposition of the reaction gas is promoted more in the peripheral portion, and thus, the film forming rate is made greater in the peripheral portion. The film forming rate with its uniformity was 4900 Å/min±2.8%.

From the above results, in order to perform processing with satisfactory uniformity in regard to both the embedding and flattening conditions and the high speed film forming condition, it can be found best to perform the processing with the planar spiral discharge coil made to have the B-shape when using the embedding and flattening conditions, and to perform the processing with the planar spiral discharge coil made to have the A-shape when using the high speed film forming condition.

Therefore, when forming a silicon oxide film 23 on the surface of the substrate 8 on which a wiring layer 22 having a step height of 8000 Å is formed as shown in FIG. 7A, the silicon oxide film 23 is deposited for four minutes under the embedding and flattening conditions with the shape of the planar spiral discharge coil 1 having the B-shape. When the silicon oxide film is deposited up to a thickness of 6000 Å (=75% of the step height) as shown in FIG. 7B, the control parameters are varied. In accordance with this timing, the shape of the planar spiral discharge coil 1 is made to have the A-shape, and then, the silicon oxide film is deposited for two minutes under the high speed film forming condition with the planar spiral discharge coil 1 having the A-shape to form a silicon oxide film having a thickness of 10400 Å as shown in FIG. 7C. As a result, the film thickness with its uniformity was a satisfactory value of 1.6 μm±1.1%. The resulting in-plane distribution of the film thickness in this case is indicated by a characteristic curve "A → B" in FIG. 8. In regard to the timing of changing the control parameters, a satisfactory result was obtained approximately in the range of 60% to 100% of the step height.

Figure 8:
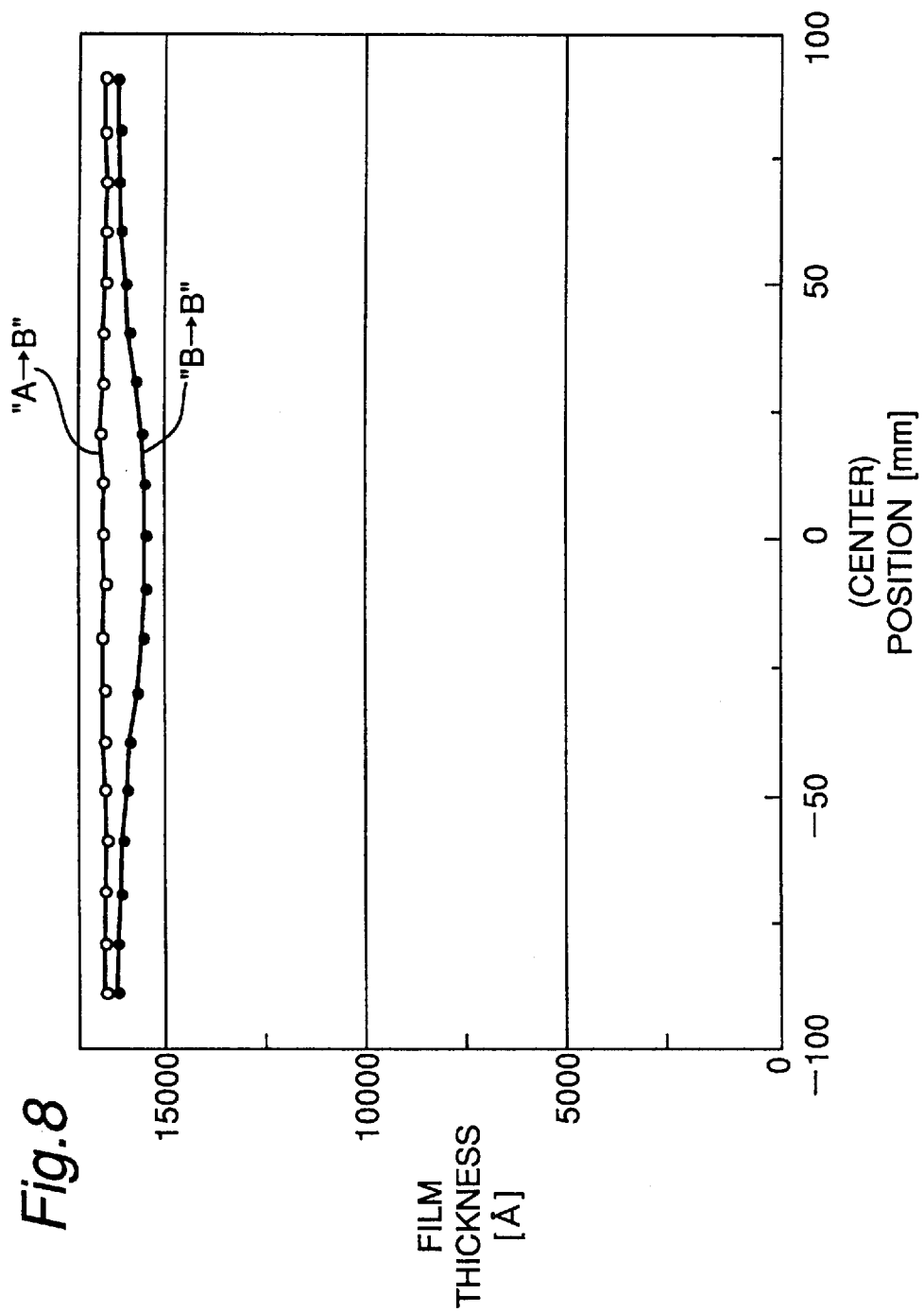
FIG. 8 is a graph showing in-plane distributions of film thickness in the case where the shape of the planar spiral discharge coil is changed and a film forming rate in the case where the shape of the planar spiral discharge coil is not changed in the first embodiment.

For the sake of comparison with the case of the characteristic curve "A → B", a film thickness distribution in a case where a silicon oxide film is deposited for four minutes under the embedding and flattening conditions with the planar spiral discharge coil 1 kept in the B-shape, thereafter the control parameters are varied, and a silicon oxide film is deposited under the high speed film forming condition is indicated by a characteristic curve "B → B" in FIG. 8. In this case, the film thickness with its uniformity was 1.6 μm±2.3%.

The above embodiment has been described by exemplifying the case where the control parameters are varied only once during the course of the processing, whereas the control parameters are sometimes changed a plurality of times in the course of the processing. In this case, the shape of the planar spiral discharge coil is changed as needed so that the uniformity of the film forming rate in the plane of the substrate obtained before and after varying each control parameter is compensated.

In the above embodiment, the plasma processing apparatus constructed so that the planar spiral discharge coil 1 is allowed to take any of the two types of the A-shape and the B-shape is shown as an example, however, the planar spiral discharge coil may have a construction capable of taking any of three or more shape types.

A second embodiment of the present invention will be described with reference to FIGS. 1, 2 and 9 through 12 taking etching of a silicon oxide film by means of the dry etching method as an example. Regarding FIGS. 1 and 2, they are provided for expressing the same things as those stated in the first embodiment, and therefore, no description is provided therefor herein.

Figure 9:
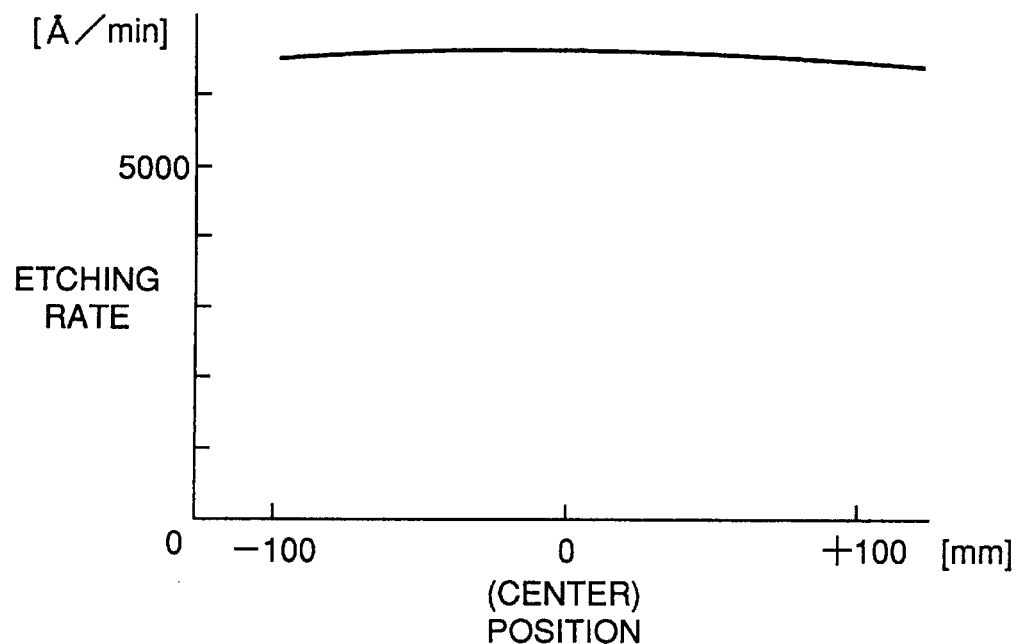
FIG. 9 is a graph showing an in-plane distribution characteristic of an etching rate according to a second embodiment of the present invention.

FIG. 9 shows an in-plane distribution of an etching rate when a substrate 8 provided with a full surface silicon oxide film is etched with the planar spiral discharge coil 1 made to have the A-shape. The control parameters of gas type, gas flow rate, pressure, high frequency power applied to the coil 1, high frequency power applied to the lower electrode 7, and their high frequency power frequencies are $C_4F_8/H_2$= 50/15 sccm, 50 mTorr, 1000 W, 300 W, and 13.56 MHz, respectively. As is apparent from FIG. 9, the in-plane distribution of the etching rate was satisfactory, and its value was 6500 Å/min±1.5%.

Figure 10:
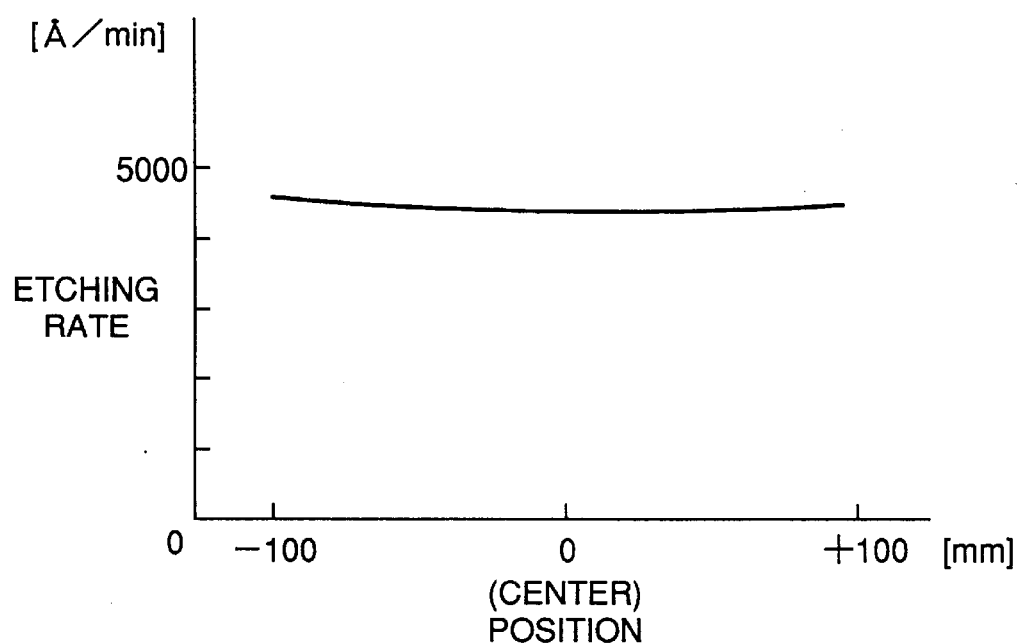
FIG. 10 is a graph showing an in-plane distribution characteristic of the etching rate of the second embodiment.

FIG. 10 shows an in-plane distribution of the etching rate when the shape of the planar spiral discharge coil 1 has the B-shape and a silicon oxide film on the substrate 8 provided with a pattern of a number of holes each having a diameter of 0.5 μm is etched (its resist is provided with a window so that only the inside of the holes can be etched). The higher the pressure is, the greater the etching rate is. Therefore, in the case of full surface etching, the etching was performed at a relatively high pressure of 50 mTorr. However, when etching minute holes, the resulting shape through the processing will worsen if the pressure is great. Furthermore, the probability of reach of ions to the bottom of the holes reduces according as the etching progresses, and therefore, the etching rate reduces. Therefore, when etching a substrate having a hole pattern, the control parameters of gas type, gas flow rate, pressure, high frequency power applied to the coil 1, high frequency power applied to the lower electrode 7, and their high frequency power frequencies were $C_4F_8/H_2$= 40/12 sccm, 5 mTorr, 1000 W, 300 W, and 13.56 MHz, respectively. As is apparent from FIG. 10, the in-plane distribution of the etching rate was satisfactory, and its value was 4500 Å/min±0.9%.

Figure 11:
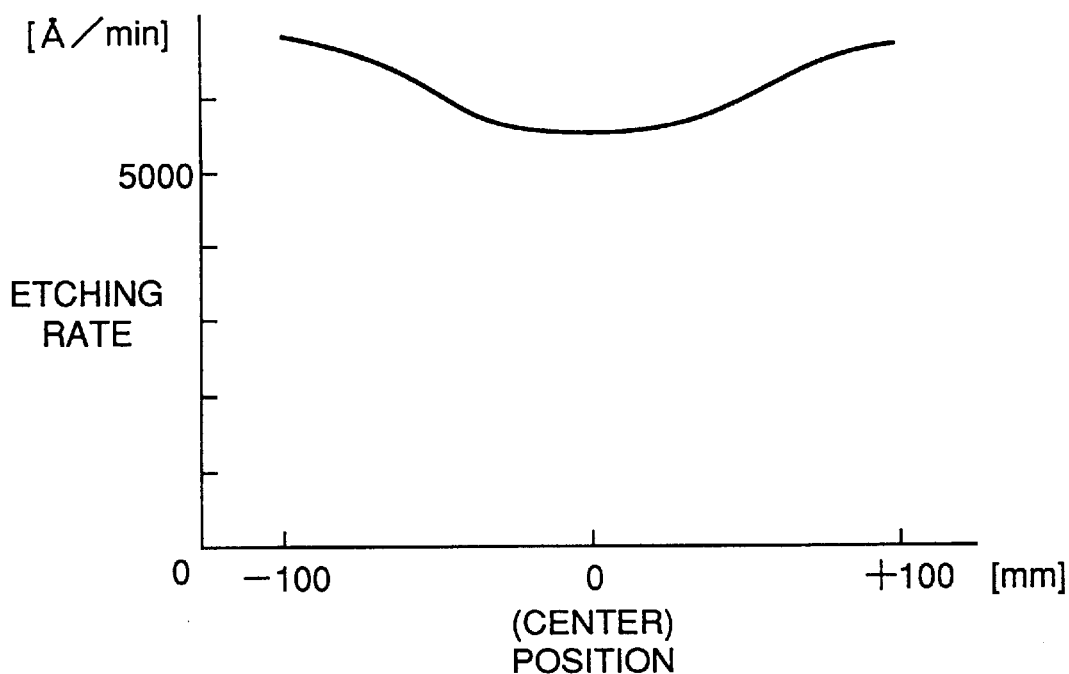
FIG. 11 is a graph showing an in-plane distribution characteristic of the etching rate of the second embodiment.

For the sake of comparison, FIG. 11 shows an in-plane distribution of the etching rate when the substrate 8 provided with the full surface silicon oxide film is etched with the planar spiral discharge coil 1 made to have the B-shape. The control parameter values are the same as those in the case where the result shown in FIG. 9 is obtained. As is apparent from FIG. 11, when the planar spiral discharge coil 1 has the B-shape, the plasma density is low in the center portion of the substrate, and conversely the plasma density is high in the peripheral portion of the substrate. Therefore, the in-plane distribution of the etching rate was worsened as compared with the case of FIG. 9. The etching rate with its uniformity was 6100 Å/min±9.7%.

Figure 12:
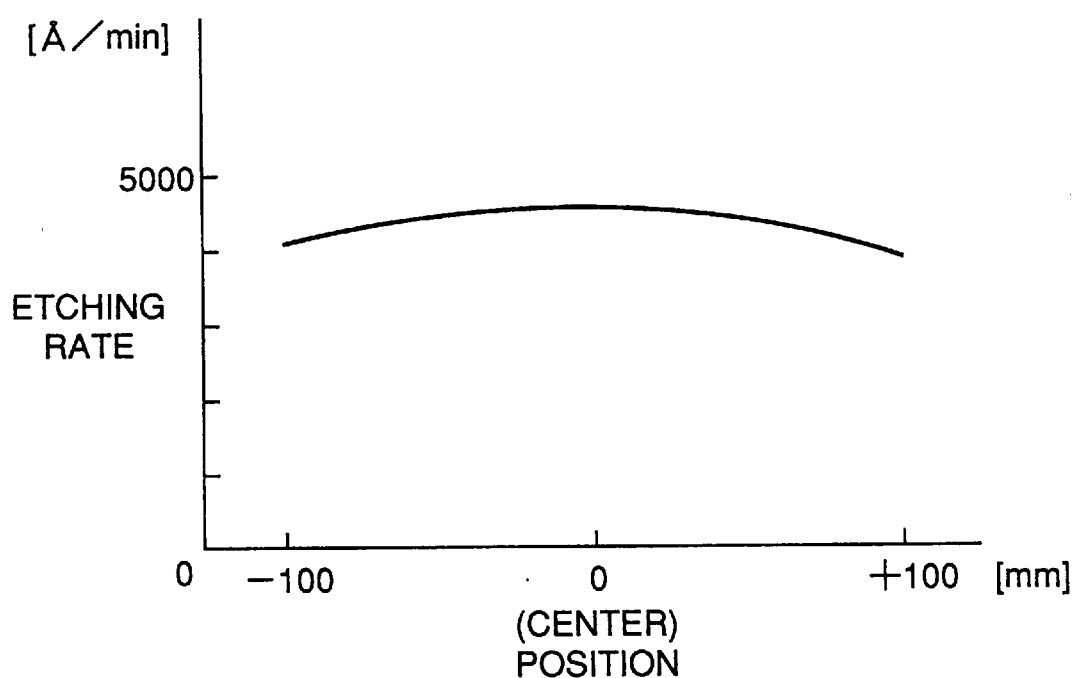
FIG. 12 is a graph showing an in-plane distribution characteristic of the etching rate of the second embodiment.

Further, FIG. 12 shows an in-plane distribution of the etching rate when the substrate 8 provided with a pattern of a number of holes each having a diameter of 0.5 μm is etched with the planar spiral discharge coil 1 has the A-shape. The control parameter values are the same as those in the case where the result shown in FIG. 10 is obtained. As is apparent from FIG. 12, when the planar spiral discharge coil 1 has the A-shape, the plasma density is high in the center portion of the substrate, and conversely the plasma density is low in the peripheral portion of the substrate. Therefore, the in-plane distribution of the etching rate was worsened as compared with the case of FIG. 10. The etching rate with its uniformity was 4300 Å/min±6.8%.

From the above results, in order to effect the etching process with satisfactory uniformity on both the substrate provided with the full surface silicon oxide film and the substrate provided with the hole pattern, it can be considered best to perform the processing with the planar spiral discharge coil having the A-shape when processing the substrate provided with the full surface silicon oxide film, and perform the processing with the planar spiral discharge coil having the B-shape when processing the substrate provided with the hole pattern. With the plasma processing apparatus used in the present embodiment, the above was able to be achieved easily.

A third embodiment of the present invention will be described with reference to FIGS. 1 and 2 taking etching of a multi-layer film comprised of a tungsten silicide film and a polysilicon film according to the dry etching method as an example. Regarding FIGS. 1 and 2, they are provided for expressing the same things as those stated in the first embodiment, and therefore, no description is provided therefor herein.

With the planar spiral discharge coil 1 having the A-shape, the tungsten silicide film which is the upper layer film of the multi-layer film comprised of the tungsten silicide film and the polysilicon film and is patterned with a resist on a substrate is etched under the following conditions.

The control parameters of gas type, gas flow rate, pressure, high frequency power applied to the coil 1, high frequency power applied to the lower electrode 7, and their high frequency power frequencies are $CF_4/SF_6$=15/15 sccm, 25 mTorr, 400 W, 200 W, and 13.56 MHz, respectively. The in-plane distribution of the etching rate was satisfactory, and its value was 2500 Å/min±2.5%.

Subsequently, the planar spiral discharge coil 1 is moved to the B-shape in the proximity of an etching terminating point of the tungsten silicide film, and the polysilicon film which is the lower layer film was etched under the following conditions. The control parameters of gas type, gas flow rate, pressure, high frequency power applied to the coil 1, high frequency power applied to the lower electrode 7, and their high frequency power frequencies are $Cl_2/HCl=30/70$ sccm, 10 mTorr, 400 W, 150 W, and 13.56 MHz, respectively. The in-plane distribution of the etching rate was satisfactory, and its value was 2700 Å/min±2.0%.

For the sake of comparison, the multi-layer film comprised of the tungsten silicide film and the polysilicon film was etched with the planar spiral discharge coil 1 kept in the A-shape. As a result, the in-plane distribution of the etching rate of the polysilicon film was 2600 Å/min±8.5%. It is to be noted that the etching was effected under the conditions that the control parameters of gas type, gas flow rate, pressure, high frequency power applied to the coil 1, high frequency power applied to the lower electrode 7, and their high frequency power frequencies were respectively $CF_4/SF_6=$ 15/15 sccm, 25 mTorr, 400 W, 200 W, and 13.56 MHz up to the proximity of the terminating point of the etching of the tungsten silicide film, and thereafter the etching was effected by varying the control parameter values to $Cl_2/HCl=30/70$ sccm, 10 mTorr, 400 W, 150 W, and 13.56 MHz, respectively.

The aforementioned embodiments have been described in the example where the silicon oxide film is formed, the example where the substrate provided with the full surface silicon oxide film and the substrate provided with the hole pattern are etched, and the example where the multi-layer film comprised of the tungsten silicide film and the polysilicon film are etched. However, the plasma processing is not limited to these, and it can be also applied to the etching of a variety of other thin films, CVD and so forth.

Figure 13:
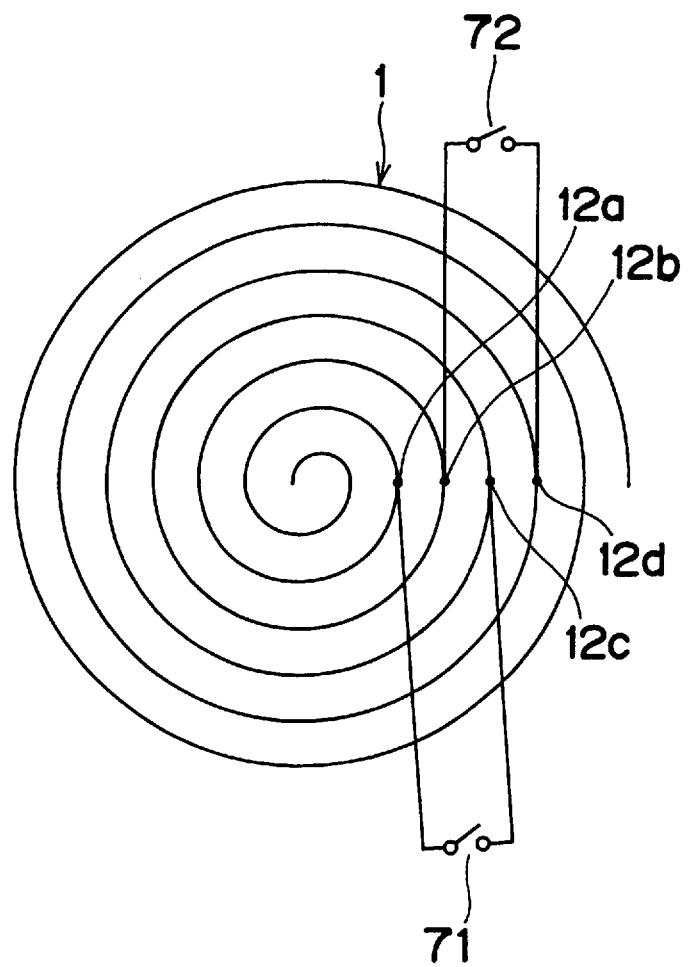
FIG. 13 is a plan view showing the construction of a planar spiral discharge coil according to a third embodiment of the present invention.

Furthermore, in each of the aforementioned embodiments, there is exemplified the plasma processing apparatus having the mechanism for turning the center axis of the planar spiral discharge coil relative to the peripheral end of the coil. However, the means for changing the shape of the planar spiral discharge coil is not limited to this. For example, as shown in FIG. 13, a mechanism for switching between coil taps 12a through 12d provided at the planar spiral discharge coil 1 may be used. In FIG. 13, comparing a case where the coil taps 12a and 12c are short-circuited when each other with a switch 72 is turned off and a switch 71 is turned on and a case where the coil taps 12b and 12d are short-circuited with each other when the switch 72 is turned on and a switch 71 is turned off, the discharge coil has a greater density in its peripheral portion as a substantial discharge coil in the case where the coil taps 12a and 12c are short-circuited with each other.

In each of the aforementioned embodiments, there is exemplified the plasma processing apparatus in which the planar spiral discharge coil is constructed so that it can assume any of the two types of the A-shape and the B-shape. However, the planar spiral discharge coil may be constructed so that it can assume any of three or more shape types.

Figure 14:
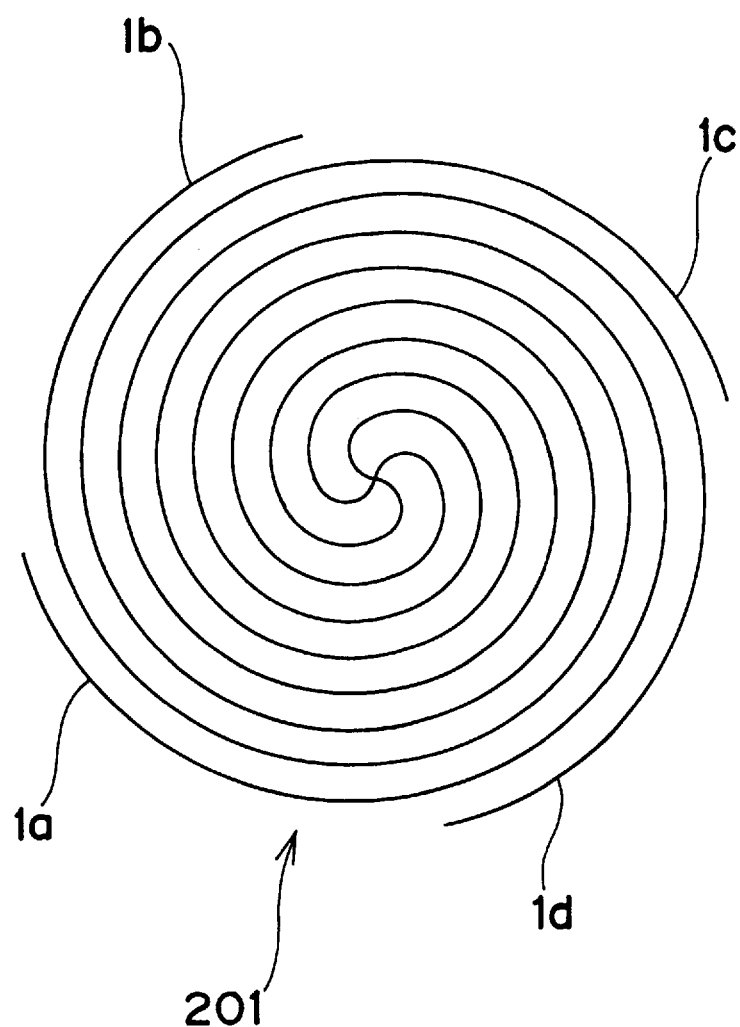
FIG. 14 is a plan view showing the construction of a planar spiral discharge coil according to a fourth embodiment of the present invention.
Figure 15:
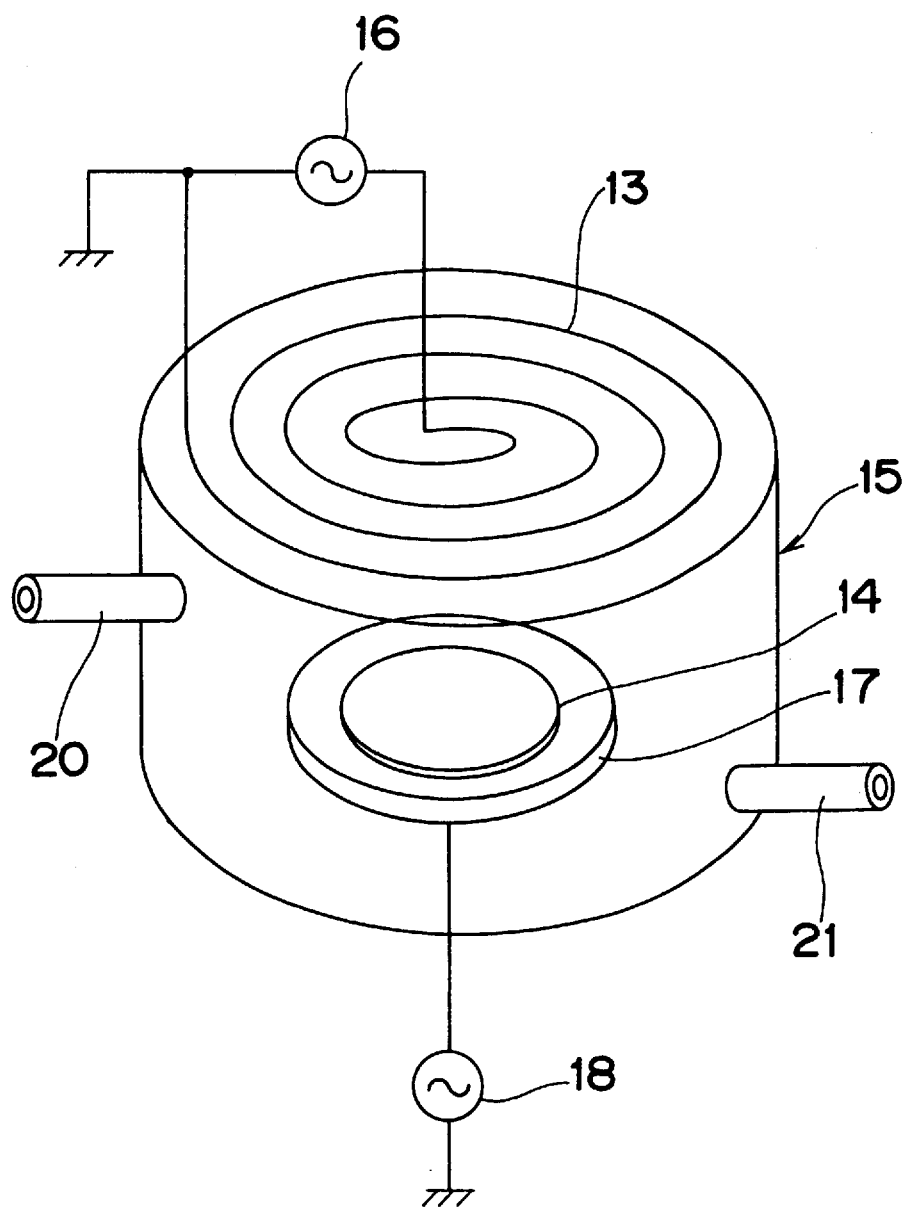
FIG. 15 is a perspective view of a prior art plasma processing apparatus.
Figure 16A:
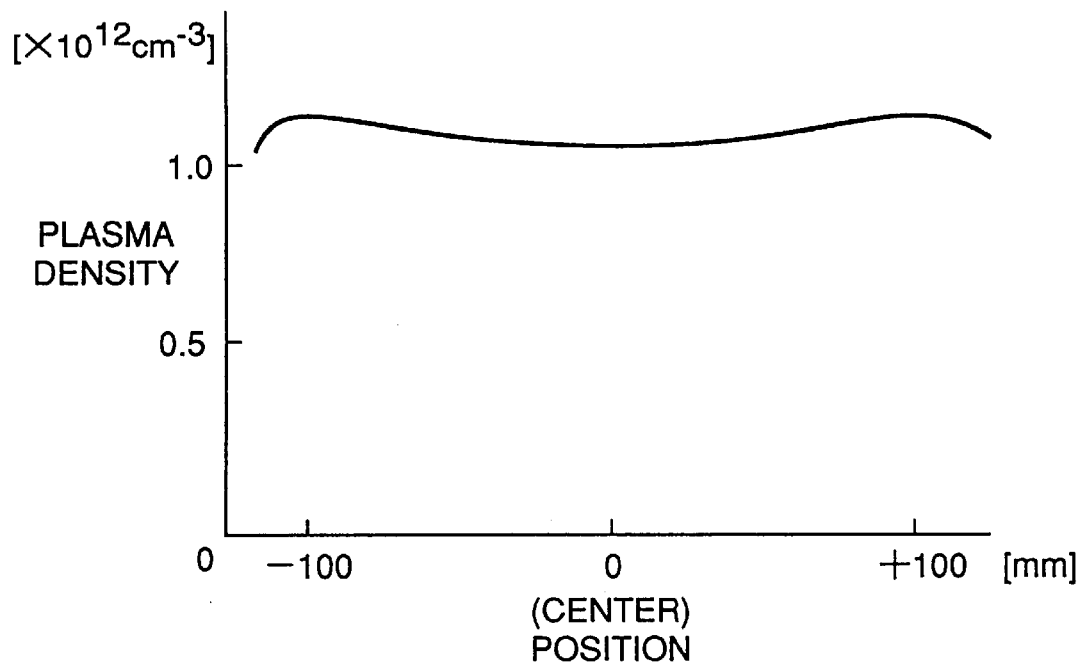
FIGS. 16A and 16B are characteristic charts showing plasma density distributions of the prior art.
Figure 16B:
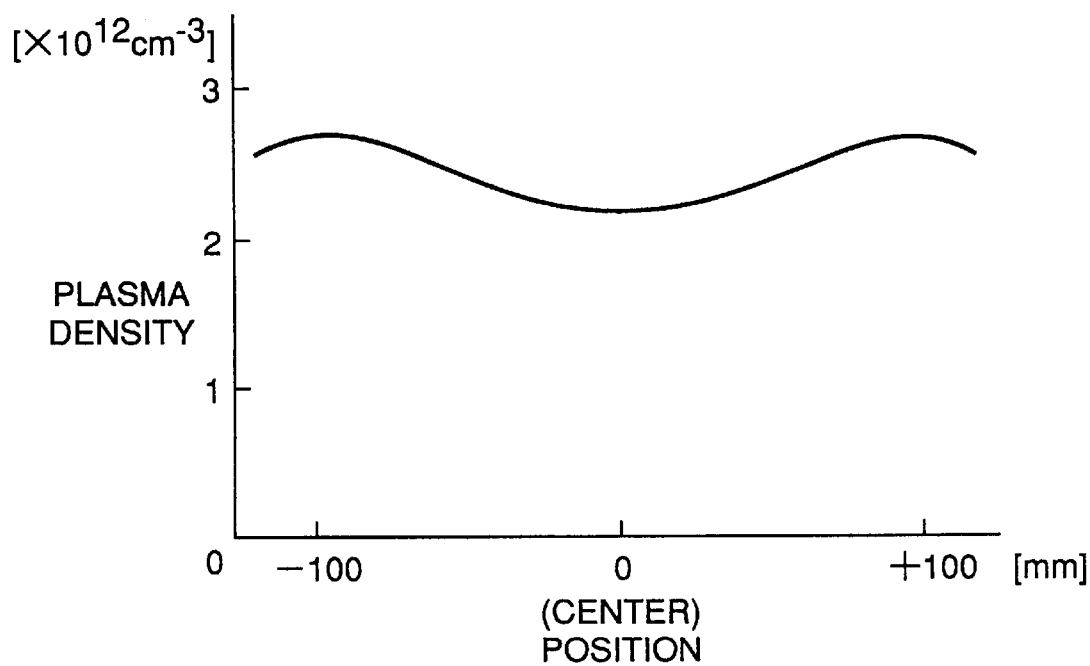

In each of the aforementioned embodiments, the planar spiral discharge coil 201 may have a multi-coil spiral shape comprised of planar spiral discharge coil elements 1a, 1b, 1c, and 1d as shown in FIG. 14. When such a coil is used, as described in the embodiments, it is acceptable to use the mechanism for turning the center axis of the planar spiral discharge coil 201 relative to the peripheral end of the coil 1 or the mechanism such as switches for switching between the coil taps provided at the discharge coil 201. Although not shown in FIG. 14, the peripheral ends of the coils are earthed or grounded.

Figure 17:
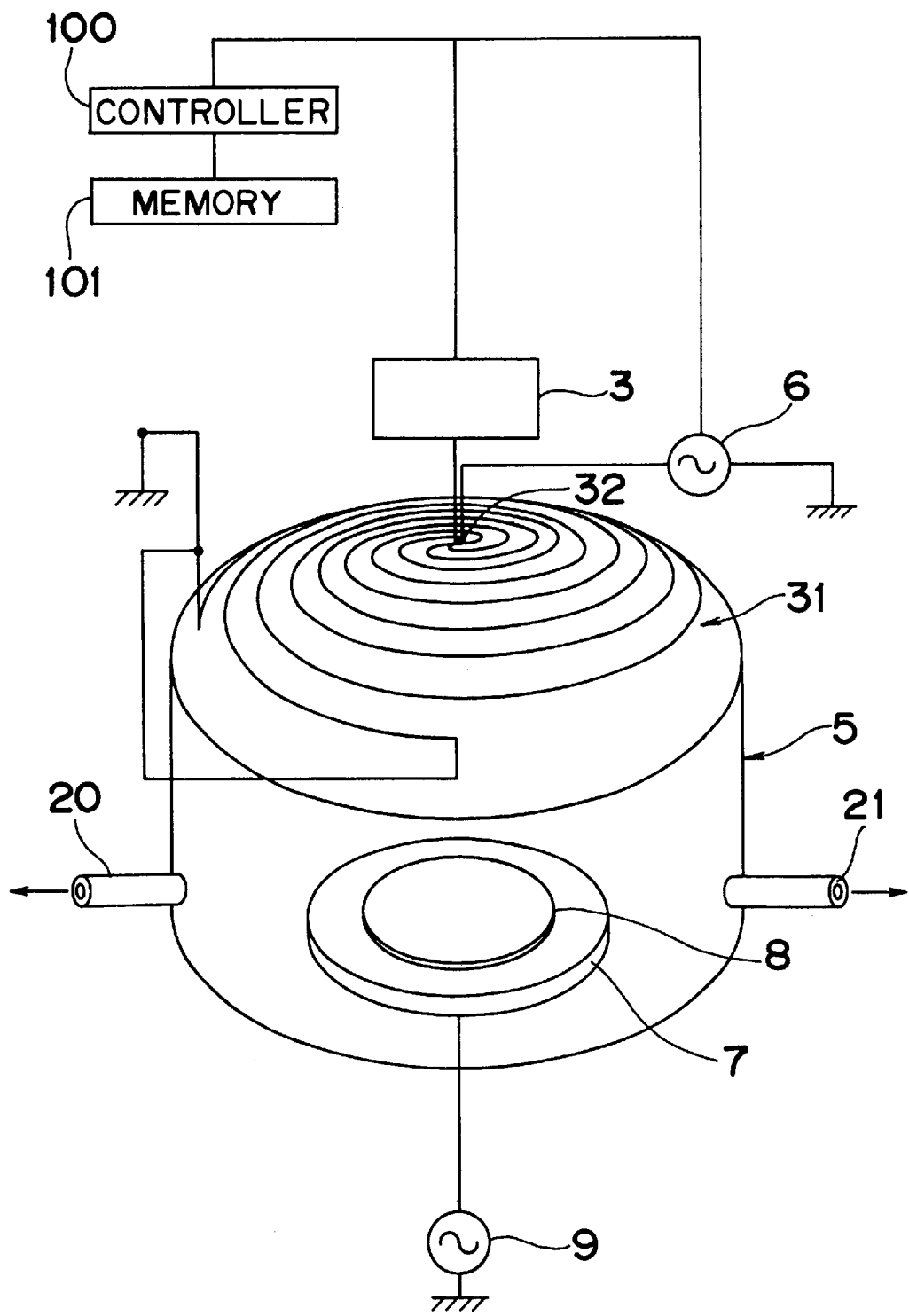
FIG. 17 is a perspective view showing the construction of a three-dimensional spiral discharge coil according to a fifth embodiment of the present invention.

The application of the present invention is not limited to the planar spiral discharge coil but the present invention can be applied to a discharge coil having a three dimensional shape as shown in FIG. 17 as an example. According to a fifth embodiment of the present invention, a discharge coil 31 in FIG. 17 has an approximately bell-shaped configuration in three dimensions and the center portion 32 of the coil 31 is rotated by the rotary shaft 4 of the stepping motor 3 so as to change the pitch in the diameter direction of the coil 31 with the planar shape of the coil 31 being the same as that of FIG. 14.

Figure 18:
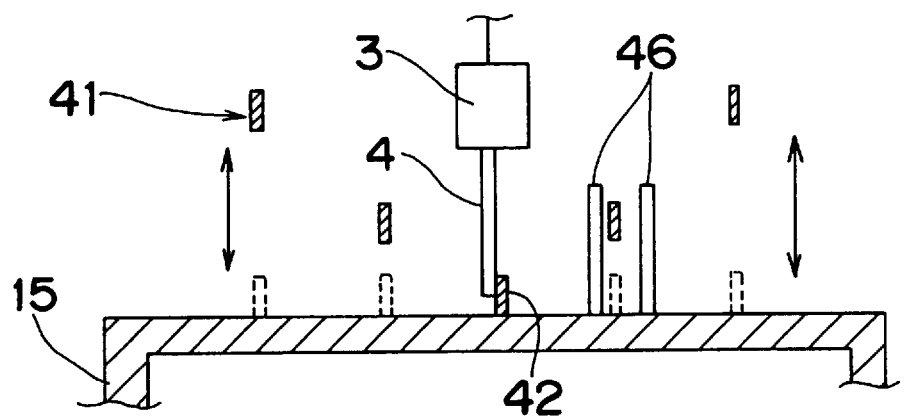
FIG. 18 is a partial sectional view showing the construction of a three-dimensional spiral discharge coil according to a sixth embodiment of the present invention.
Figure 19:
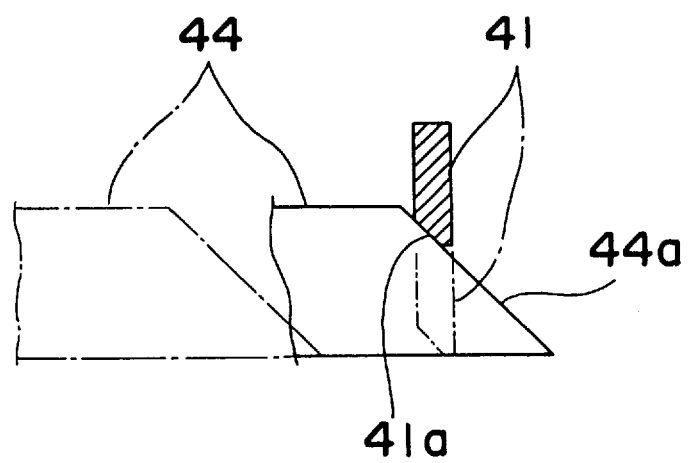
FIG. 19 is an enlarged sectional view of a part of the discharge coil of FIG. 18.

According to a sixth embodiment of the present invention, FIG. 18 shows a spiral discharge coil 41 capable of forming both a planar spiral shape and an inverted approximately bell-shaped configuration in three dimensions. The center portion 42 of the coil 41 is rotated by the rotary shaft 4 of the stepping motor 3 so as to change the pitch in the diameter direction of the coil 41 and change the three-dimensional shape. As shown in FIG. 19, wedge members 44 each of which has an inclined surface 44a are arranged at suitable intervals (e.g. 45 degrees) around the coil 41 with each of the wedge members 44 capable of moving along a diameter of the coil 41 back and forth. The coil 41 has an inclined surface 41a formed at the peripheral side of the lower end surface of the discharge coil 41 which is capable of sliding on the inclined surfaces 44a of the wedge members 44. When the wedge members 44 are moved toward the center of the coil 41, the inclined surfaces 44a of the wedge members 44 come in contact with the inclined surface 41a of the coil 41 at a plurality of portions of the coil 41 and the inclined surface 41a slides on the inclined surfaces 44a and the coil 41 is moved upward so that the coil 41 will form the approximately bell-shaped configuration in three dimensions as sectionally shown in FIG. 18. On the other hand, when the wedge members 44 are moved toward the peripheral side opposite to the center side of the coil 41, the inclined surfaces 44a of the wedge members 44 move away from the inclined surfaces 41a of the coil 41 so that the coil 41 forms a planar spiral shape in two dimensions. By adjusting the moving amounts of the wedge members 44 and thus, adjusting the upward moving amounts of the coil 41, the coil 41 can assume either one of the inverted approximately bell-shaped configuration in three dimensions as shown in FIG. 18 and the planar spiral shape. As a result, by adjusting the upward moving amounts of the portions of the coil 41, the pitch of the coil 41 in its diameter direction can be changed to change the shape of the coil 41 so as to control the plasma density in-plane distribution.

Figure 20:
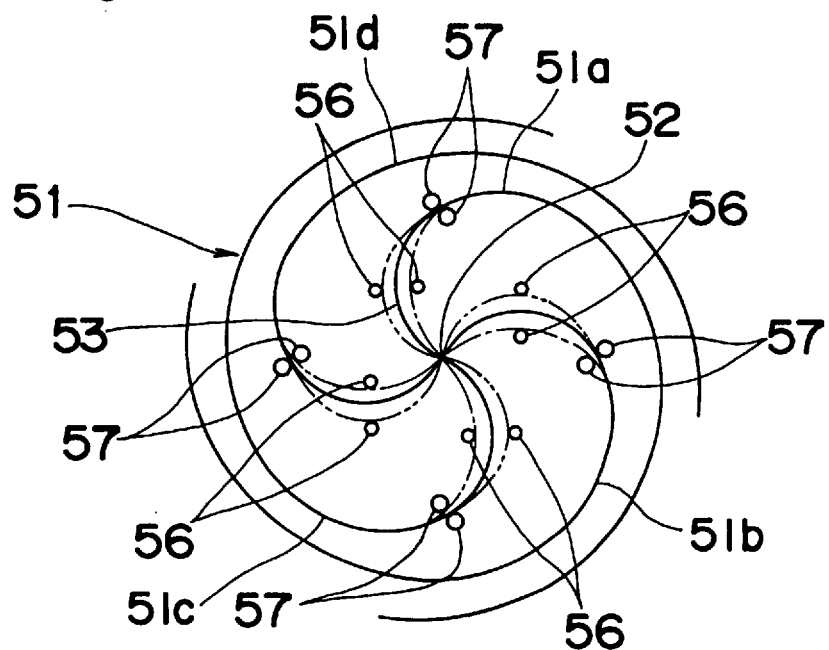
FIG. 20 is a plan view showing a part of the construction of a spiral discharge coil according to a seventh embodiment of the present invention.

According to a seventh embodiment of the present invention, as shown in FIG. 20, a discharge coil 51 may have a multi-coil spiral shape comprised of the planar spiral discharge coil elements 51a, 51b, 51c, and 51d which is similar to the multi-coil spiral shape comprised of the planar spiral discharge coil elements 1a, 1b, 1c, and 1d as shown in FIG. 14. Only a portion of each of the planar spiral discharge coil elements 51a, 51b, 51c, and 51d from its center side 52 of each element to a section which is fixed by a pair of stoppers 57 can be moved between a gap defined by a pair of guides 56 in the diameter direction of the coil 51. Then, each movable portion of the coil 51 can move between a position shown by one dotted chain lines clockwise located from the solid line position and a position shown by two dotted chain lines counterclockwise located from the solid line position while between the pair of guides 56. Thus, the pitch in the diameter direction of the coil 51 is varied to change the shape of the coil 51 so as to control a plasma density in-plane distribution.

Figure 21:
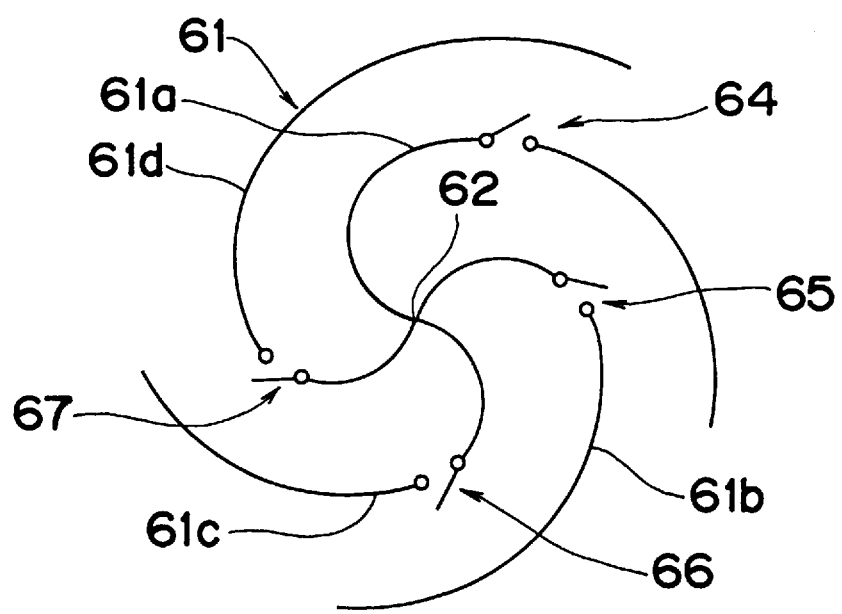
FIG. 21 is a plan view showing a part of the construction of a spiral discharge coil according to an eighth embodiment of the present invention.

According to an eighth embodiment of the present invention, as shown in FIG. 21, a planar spiral discharge coil 61 may have a multi-coil spiral shape comprised of planar spiral discharge coil elements 61a, 61b, 61c, and 61d which is similar to the multi-coil spiral shape comprised of the planar spiral discharge coil elements 1a, 1b, 1c, and 1d as shown in FIG. 14. The coil 61 has switches 64, 65, 66, and 67 for opening and closing the coil elements 61a, 61b, 61c, and 61d which are arranged between center side ends 62 and peripheral side ends. Then, the switches 64, 65, 66, and 67 are turned on or turned off to select any number and any position of coil elements among the four coil elements 61a, 61b, 61c, and 61d. As a result, the pitch in the diameter direction of the coil 61 is varied to change the shape of the coil 61 so as to control a plasma density in-plane distribution.

Figure 22:
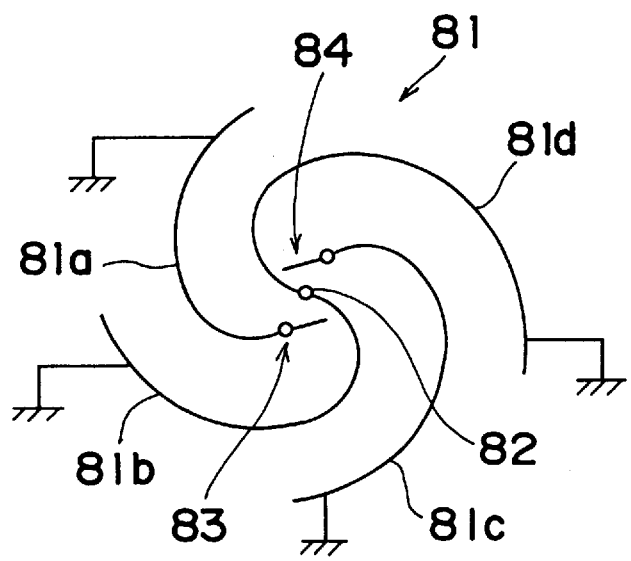
FIG. 22 is a plan view showing a part of the construction of a spiral discharge coil according to a ninth embodiment of the present invention.

According to a ninth embodiment of the present invention, as shown in FIG. 22, a spiral discharge coil 81 has two discharge coil elements 81b, 81d whose center side ends 82 are connected to each other and whose peripheral side ends are earthed or grounded while two other coil elements 81a, 81c whose peripheral side ends are earthed or grounded and which have switches 83, 84 at their center side ends. The switches 83, 84 can be turned on or turned off to connect any of the coil elements 81a, 81c to the coil elements 81b, 81d. Thus, the pitch in the diameter direction of the coil 81 is varied to change the shape of the coil 81 so as to control a plasma density in-plane distribution.

Figure 23:
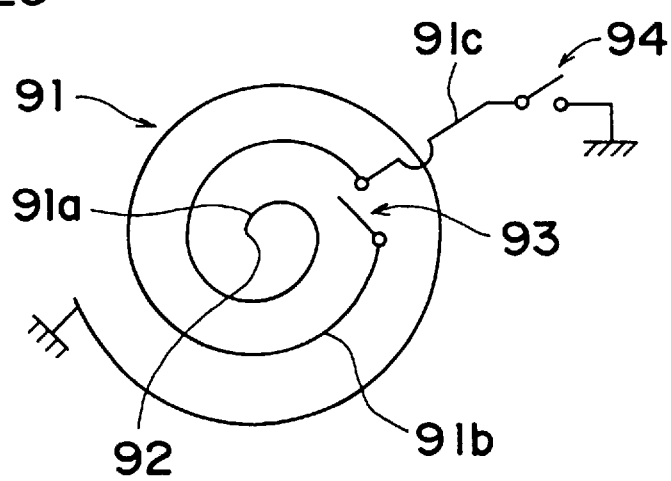
FIG. 23 is a plan view showing a part of the construction of a spiral discharge coil according to a tenth embodiment of the present invention.

According to a tenth embodiment of the present invention, as shown in FIG. 23, a spiral discharge coil 91 has a switch 93 arranged between a center side end 92 and grounded peripheral side end of the coil 91 so as to divide the portion between the center side end 92 and the peripheral side end of the coil 91. A bypass portion 91c extended from the proximity to the center side end 92 toward the outer side in the diameter direction of the coil 91 and grounded at its peripheral side end is arranged with a switch 94 arranged at its middle portion. When the switch 93 is turned on and the switch 94 is turned off, a center side portion 92 of the coil 91 is connected to a peripheral side portion 91b of the coil 91 to form the coil 91. On the other hand, when the switch 94 is turned on and the switch 93 is turned off, the center side portion 92 of the coil 91 is connected to the bypass portion 91c to form the coil 91. Thus, the pitch in the diameter direction of the coil 91 is varied to change the shape of the coil 91 so as to control a plasma density in-plane distribution.

As described above, a discharge coil having any shape and any length can be formed by switching coil taps having the above switches 71, 72, 64–67, 83, 84, 93, 94 and turning on or turning off the switches so as to connect the coil elements to each other.

In each of the embodiments, the rotary shaft 4 of the stepping motor 3 is rotated to rotate the center side end of each coil to change the pitch in the diameter direction of the coil. Instead of the rotation of the center side end, the movable portion of the coil can be moved in the peripheral direction to change the pitch in the diameter direction of the coil by moving the pair of guides or a suitable driving member.

According to the plasma processing method of the present invention, the shape of the spiral discharge coil is changed so that the pitch in the diameter direction of the planar or three dimensional spiral discharge coil is partially varied in accordance with the timing of varying at least one of the control parameters of gas type, gas flow rate, pressure, the magnitudes of the high frequency powers applied to the coil and the lower electrode, and their high frequency power frequencies. Therefore, the uniformity of processing is not impaired even when any control parameter is changed in the course of processing.

According to the plasma processing apparatus of the present invention, there is provided the means for changing the shape of the spiral discharge coil so that the pitch in the diameter direction of the coil is partially varied. With this arrangement, the in-plane distribution of plasma density can be controlled to allow a plurality of processes having different control parameters to be performed with satisfactory uniformity.

When the means for changing the shape of the spiral discharge coil is implemented by, for example, the mechanism for turning the center axis of the spiral discharge coil relative to the peripheral end of the spiral discharge coil or the mechanism for switching between the coil taps provided at the spiral discharge coil, the pitch in the diameter direction of the coil can be partially varied in the center portion and the peripheral portion of the spiral discharge coil with a relatively simple structure.

In accordance with the timing of varying each control parameter in the course of film formation, a film is formed on the substrate by changing the shape of the spiral discharge coil so that the uniformity of film forming rate obtained before and after varying the control parameter is compensated. Therefore, a flat film can be formed efficiently.

Furthermore, by varying each control parameter in accordance with the timing at which the film is deposited up to about 60% to 100% of the step height formed on the substrate, and changing the shape of the spiral discharge coil so that the uniformity of film forming rate obtained before and after varying the control parameter is compensated in accordance with the timing of varying the control parameter, a satisfactory flat film can be formed at high speed.

Furthermore, when etching the substrate, by effecting the etching in accordance with the timing of varying each control parameter in the course of etching while changing the shape of the spiral discharge coil so that the uniformity of etching rate obtained before and after varying the control parameter is compensated, satisfactory etching can be achieved. When the timing of varying the control parameter is located in the proximity of the terminating point of the upper layer film that is the constituent element of the multi-layer film, a satisfactory etching result can be obtained efficiently.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A plasma processing method for processing a substrate, said method comprising:

placing the substrate on an electrode in a vacuum chamber;

introducing a gas into the vacuum chamber while discharging gas from the interior of the vacuum chamber;

applying a high frequency voltage to a spiral discharge coil while maintaining a pressure in the vacuum chamber so as to generate plasma inside of the vacuum chamber, wherein the spiral discharge coil has a coil pitch;

varying at least one control parameter while the substrate is being processed, wherein the control parameters include gas type, gas flow rate, pressure, magnitude of the high frequency power applied to the spiral discharge coil and the electrode, and their power frequency; and changing the pitch of the spiral discharge coil in a diameter direction of the coil in accordance with the timing of the varying of any of the control parameters so as to control the plasma density in-plane distribution.

2. The plasma processing method as claimed in claim 1, wherein the plasma density in-plane distribution is uniformly controlled.

3. The plasma processing method as claimed in claim 1, wherein the spiral discharge coil has a planar spiral shape.

4. The plasma processing method as claimed in claim 1, wherein the spiral discharge coil comprises a plurality of planar spiral discharge coil elements.

5. A plasma processing method for forming a film on a substrate, said method comprising:

placing the substrate on an electrode disposed in a vacuum chamber;

introducing gas into the vacuum chamber while discharging gas from the interior of the vacuum chamber;

applying a high frequency voltage to a spiral discharge coil while maintaining the pressure in the vacuum chamber at a level to generate a plasma inside of the vacuum chamber;

varying at least one control parameter while the substrate is processed, wherein the control parameters include gas type, gas flow rate, pressure, magnitude of high frequency power applied to the spiral discharge coil and the electrode, and their power frequency; and changing a shape of the spiral discharge coil so that uniformity of film forming rate, obtained before and after varying the control parameter, is compensated in accordance with a timing of varying the control parameter during the course of forming the film.

6. The plasma processing method as claimed in claim 5, wherein the control parameter varying operation is performed in accordance with the timing of formation of a film on the substrate which is as the film is deposited up to about 60% to 100% of a step height formed on the substrate, and compensating the uniformity of film forming rate, obtained before and after varying the control parameter, by changing the spiral discharge coil shape in accordance with the timing of varying the control parameter.

7. The plasma processing method as claimed in claim 5, wherein the gas is used for CVD.

8. A plasma processing method for etching a substrate, the method comprising:

placing the substrate on an electrode in a vacuum chamber;

introducing gas into the vacuum chamber while discharging gas from inside of the vacuum chamber;

applying a high frequency voltage to a spiral discharge coil while maintaining an interior pressure in the vacuum chamber so as to generate a plasma inside of the vacuum chamber;

varying at least one of a plurality of control parameters while the substrate is being processed, wherein the control parameters includes gas flow type, gas flow rate, pressure, magnitude of the high frequency power applied to the spiral discharge coil and the electrode, and the power frequency; and changing a shape of the spiral discharge coil so that a uniformity of etching rate, obtained before and after said varying of the at least one control parameter, is compensated in accordance with a timing of varying the at least one control parameter during the course of etching.

9. The plasma processing method as claimed in claim 8, wherein a multi-layer film is formed as a film to be etched on the substrate, and the timing of the control parameter varying operation occurs in proximity to a terminating point of an upper layer film which is a constituent element of the multi-layer film.

10. The plasma processing method as claimed in claim 8, wherein the gas is used for dry etching.

11. A plasma processing apparatus comprising:

a vacuum chamber;

an electrode for receiving a substrate thereon, said electrode being disposed in said vacuum chamber;

a spiral discharge coil provided on a surface of said vacuum chamber, said spiral discharge coil having a shape and a coil pitch;

a high frequency voltage source for applying a high frequency voltage to said spiral discharge coil in order to generate a plasma; and a device for changing the shape of said spiral discharge coil so that the coil pitch, in a diameter direction of said spiral discharge coil, is partially changed, thereby allowing a plasma density in-plane distribution to be controlled.

12. The plasma processing apparatus as claimed in claim 11, wherein said spiral discharge coil comprises a plurality of planar spiral discharge coil elements.

13. The plasma processing apparatus as claimed in claim 11, wherein said device for changing said spiral discharge coil shape comprises a mechanism for turning a center side end of said spiral discharge coil relative to an outer peripheral side end of said spiral discharge coil.

14. The plasma processing apparatus as claimed in claim 11, wherein said device for changing said spiral discharge coil shape comprises:

a rotary shaft connected to a central portion of said spiral discharge coil; and a stepping motor for rotating said rotary shaft.

15. The plasma processing apparatus as claimed in claim 14, further comprising a plurality of pairs of guide members, wherein each pair of guide members includes first and second guide members disposed on opposite sides of said spiral discharge coil of guide members.

16. The plasma processing apparatus as claimed in claim 11, further comprising a plurality of coil taps provided at said spiral discharge coil, wherein said device for changing said spiral discharge coil shape comprises a mechanism for switching between said coil taps.

* * * * *